(12) United States Patent
Lee

(10) Patent No.: US 11,852,690 B2
(45) Date of Patent: Dec. 26, 2023

(54) METHOD AND SYSTEM FOR ESTIMATING DEGRADATION OF BATTERY FOR VEHICLE

(71) Applicants: Hyundai Motor Company, Seoul (KR); Kia Corporation, Seoul (KR)

(72) Inventor: Jung Hyun Lee, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/701,151

(22) Filed: Mar. 22, 2022

(65) Prior Publication Data

US 2023/0030372 A1 Feb. 2, 2023

(30) Foreign Application Priority Data

Jul. 29, 2021 (KR) .................. 10-2021-0100185

(51) Int. Cl.
*G01R 31/392* (2019.01)
*H02J 7/00* (2006.01)
*G01R 31/389* (2019.01)

(52) U.S. Cl.
CPC ......... *G01R 31/392* (2019.01); *G01R 31/389* (2019.01); *H02J 7/005* (2020.01); *H02J 7/0048* (2020.01); *H02J 7/0063* (2013.01)

(58) Field of Classification Search
None
See application file for complete search history.

(56) References Cited

U.S. PATENT DOCUMENTS

| | | | |
|---|---|---|---|
| 2016/0097819 A1* | 4/2016 | Ohkawa | G01R 31/389 324/430 |
| 2018/0246174 A1* | 8/2018 | Shimosawa | G01R 31/389 |
| 2019/0067758 A1 | 2/2019 | Yamada | |
| 2021/0152001 A1* | 5/2021 | Nagai | H01M 10/48 |
| 2022/0413055 A1* | 12/2022 | Kondo | G01R 31/3835 |

FOREIGN PATENT DOCUMENTS

| | | |
|---|---|---|
| JP | 2006-0098135 A | 4/2006 |
| JP | 2007-0057433 A | 3/2007 |
| JP | 2007-0057434 A | 3/2007 |
| JP | 2018-0205313 A | 12/2018 |
| JP | 2020-0085599 A | 6/2020 |
| KR | 101500128 B1 | 3/2015 |
| KR | 2019-0099904 A | 8/2019 |

* cited by examiner

*Primary Examiner* — Jas A Sanghera
(74) *Attorney, Agent, or Firm* — Fox Rothschild LLP

(57) ABSTRACT

A method and a system for estimating degradation of a battery for an electric vehicle are provided. The method includes determining a current battery resistance increase rate by measuring an increase in resistance of the battery during charging of the battery, determining an initial battery resistance increase rate on the basis of a predetermined initial battery resistance increase rate map for indicating the battery resistance increase rate of the battery in a begin of life (BOL) state, and calculating current degradation of the battery on the basis of the current battery resistance increase rate and the initial battery resistance increase rate.

13 Claims, 5 Drawing Sheets

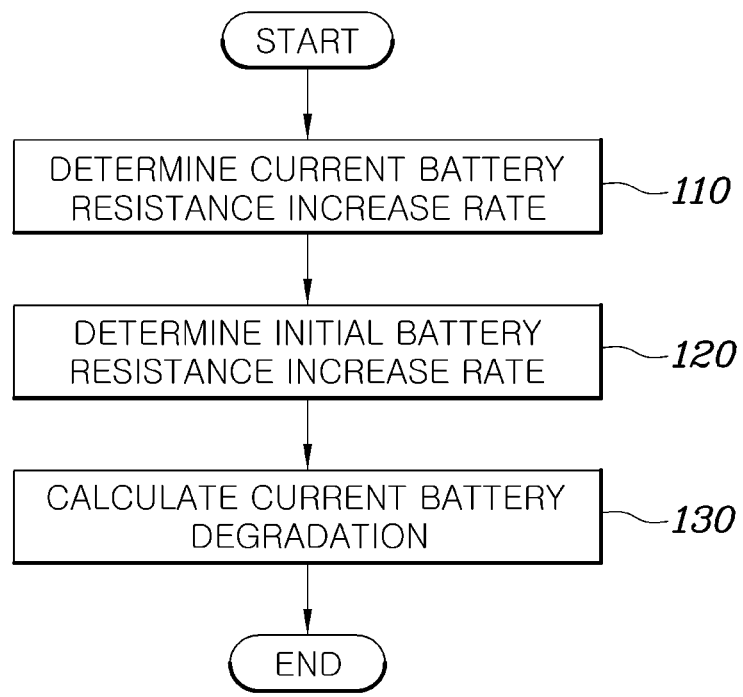

[FIG. 2]

| ITEMS | −20℃ | ・・・ | 40℃ |
|---|---|---|---|
| 3.3kW | V1a | V1b | V1c |
| 6.6kW | V2a | V2b | V2c |
| ・・・ | V3a | V3b | V3c |
| 50kW | ・・・ | ・・・ | ・・・ |
| 100kW | ・・・ | ・・・ | ・・・ |
| 150kW | Vna | Vnb | Vnc |

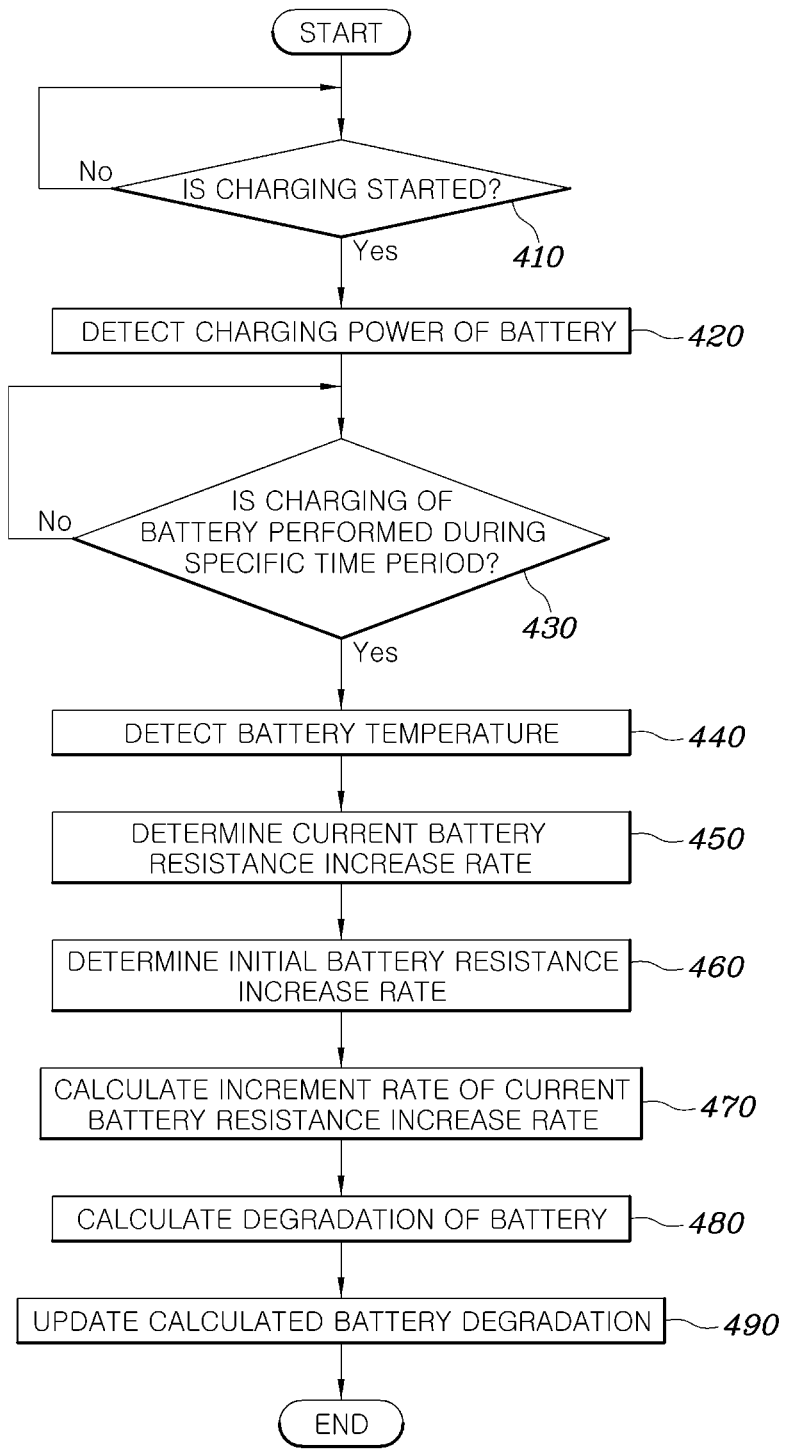
[FIG. 4]

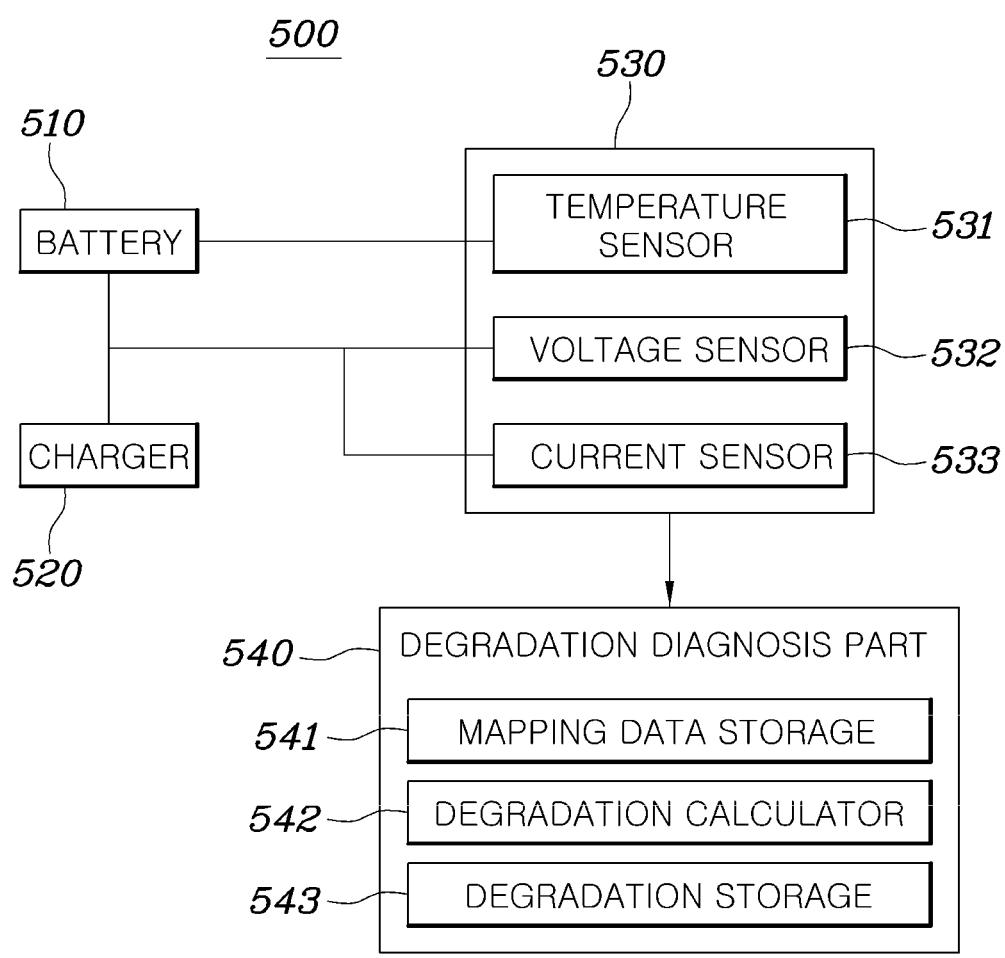
[FIG. 5]

METHOD AND SYSTEM FOR ESTIMATING DEGRADATION OF BATTERY FOR VEHICLE

CROSS REFERENCE TO RELATED APPLICATION

The present application claims under 35 U.S.C. § 119(a) the benefit of Korean Patent Application No. 10-2021-0100185 filed on Jul. 29, 2021 in the Korean Intellectual Property Office, the entire contents of which are incorporated herein by reference.

BACKGROUND

Technical Field

Embodiments of the present disclosure relate to a method and a corresponding system for estimating degradation of a battery for an electric vehicle, and more particularly, to a method and a corresponding system for estimating degradation of a battery, and which is capable of accurately estimating battery degradation in a more simplified manner as compared to existing techniques.

Description of the Related Art

High-voltage batteries store electric energy for use as driving forces electric vehicles (EVs) or plug-in hybrid electric vehicles (PHEVs). The capacities or states of the high-voltage batteries significantly affect mileages of the vehicles. However, due to characteristics of the battery, when the battery is continuously used, it is unavoidable that degradation in that the capacity of the battery occurs, decreasing the battery capacity. When degradation progresses, even when the same amount of state of charge (SOC) is displayed, phenomena such as a decrease in mileage and a decrease in output for acceleration occur. When such phenomena are not properly detected, customer complaints for not knowing causes may occur.

As a method of solving these problems, a technique using an open circuit voltage (OCV) among conventional methods of estimating degradation of a battery for a vehicle is also known. This conventional technique mainly derives an SOC of the battery by simply considering a measured terminal voltage of the battery as an OCV. However, since the terminal voltage of the battery differs from the OCV according to a previous usage environment of a vehicle to which the battery is applied, there may be a problem in that accuracy of degradation estimation is degraded.

As described above, in the currently developed EV/PHEV, there are no measures to accurately estimate battery degradation.

The foregoing is intended merely to aid in understanding of the background of embodiments of the present disclosure, and is not intended to mean that the disclosed embodiments fall within the purview of the related art that is already known to those skilled in the art.

SUMMARY

Accordingly, embodiments of the present disclosure have been made keeping in mind the above problems occurring in the related art, and are intended to propose a method and a corresponding system for estimating degradation of a battery. As discussed in greater detail below, embodiments of the disclosed methods and system provide high accuracy in a simplified manner by estimating degradation of a battery of a vehicle on the basis of comparing a battery resistance increase rate after degradation compared to an initial battery resistance increase rate. Embodiments of the present disclosure are not limited to the technical problems as described above, and other technical problems can be derived from the following description.

According to one aspect, there is provided a method of estimating degradation of a battery for a vehicle, which includes determining a current battery resistance increase rate by measuring an increase in resistance of the battery during charging of the battery, determining a battery resistance increase rate in an initial state, and calculating current degradation of the battery on the basis of the current battery resistance increase rate and the initial battery resistance increase rate. In this manner, a more accurate battery degradation value can be estimate through a simplified arithmetic operation.

An initial battery resistance increase rate map may include information regarding a battery resistance increase rate corresponding to a battery temperature and battery charging power that is mapped with respect to a battery in a begin of life (BOL) state.

Determining the initial battery resistance increase rate may include identifying a temperature value of the battery and a charging power value for charging the battery, and determining in the initial battery resistance increase rate map, a mapped battery resistance increase rate value corresponding to the temperature value of the battery and the charging power value as the initial battery resistance increase rate.

Determining the current battery resistance increase rate may include measuring the resistance of the battery, which is increased during a time period satisfying a specific condition of the entire charging period of the battery.

The specific condition may include either a condition in which the battery is charged in a predetermined target voltage section or a condition in which the battery is charged in a predetermined target state of charge (SOC) section.

The specific condition may include a condition in which the battery is charged with a constant current.

Calculating the current battery degradation may include calculating an incremental rate of the current battery resistance increase rate compared to the initial battery resistance increase rate, and calculating a current battery degradation value by multiplying the increase rate by a degradation trend constant K.

The degradation trend constant K may be a proportional constant of the battery degradation compared to the resistance increase rate of the battery derived by a degradation principle test of the battery.

The method may further include updating the calculated current battery degradation value to the latest battery degradation value of the vehicle.

According to another embodiment of the present disclosure, a method of estimating degradation of a battery for a vehicle is provided. The method includes determining whether to start charging of a battery of a vehicle; when the vehicle charging is started, detecting charging power for charging the battery; determining whether the battery charging is performed during a specific time period; when the battery charging is performed during the specific time period, measuring a temperature of the battery; determining a current battery resistance increase rate by measuring resistance of the battery increased during the specific time period; determining a battery resistance increase rate in an initial state; calculating an incremental rate of the current battery resistance increase rate compared to the initial battery resistance increase rate; and calculating degradation of the battery by multiplying the incremental rate of the current battery resistance increase rate compared to the initial battery resistance increase rate by a degradation trend constant.

According to still another embodiment of the disclosure, a system for estimating degradation of a battery for a vehicle is provided. The system includes a battery configured to supply power for driving a motor of a vehicle, a charger configured to charge the battery, a measurement device configured to measure characteristics of the battery and the charger, and a controller configured to calculate current degradation of the battery. The controller includes a mapping data storage configured to store a battery resistance increase rate map in an initial state, and a degradation calculator configured to measure resistance of the battery increased during a charging period of the battery, to determine a current battery resistance increase rate, to determine an initial battery resistance increase rate on the basis of the initial battery resistance increase rate map, and to calculate the current battery degradation of the battery on the basis of the current battery resistance increase rate and the initial battery resistance increase rate.

The initial battery resistance increase rate map may include information in which a battery resistance increase rate corresponding to a battery temperature and battery charging power is mapped with respect to a battery in a begin of life (BOL) state.

The measurement device may be configured to measure the temperature of the battery and the charging power for charging the battery and to provide the measured values to the degradation calculator. The degradation calculator may be configured to determine, in the initial battery resistance increase rate map, a mapped battery resistance increase rate value corresponding to the measured values of the temperature of the battery and the charging power, which are received from the measurement device, as the initial battery resistance increase rate.

The degradation calculator may be configured to calculate an incremental rate of the current battery resistance increase rate compared to the initial battery resistance increase rate and to calculate the current battery degradation by multiplying the incremental rate by a degradation trend constant K.

The controller may further include a degradation storage configured to update the calculated current battery degradation to the latest battery degradation value of the vehicle.

BRIEF DESCRIPTION OF THE DRAWINGS

The above and other objects, features and other advantages of the present disclosure will be more clearly understood from the following detailed description when taken in conjunction with the accompanying drawings, in which:

FIG. 1 is a flowchart illustrating a method of estimating degradation of a battery of an electric vehicle according to one embodiment of the present disclosure;

FIG. 2 is a diagram illustrating an initial battery resistance increase rate map according to one embodiment of the present disclosure;

FIG. 4 is a flowchart illustrating a method of estimating degradation of a battery of an electric vehicle according to one embodiment of the present disclosure; and FIG. 5 is a block diagram illustrating a system for estimating degradation of a battery of an electric vehicle according to one embodiment of the present disclosure.

DETAILED DESCRIPTION

Figure 3:
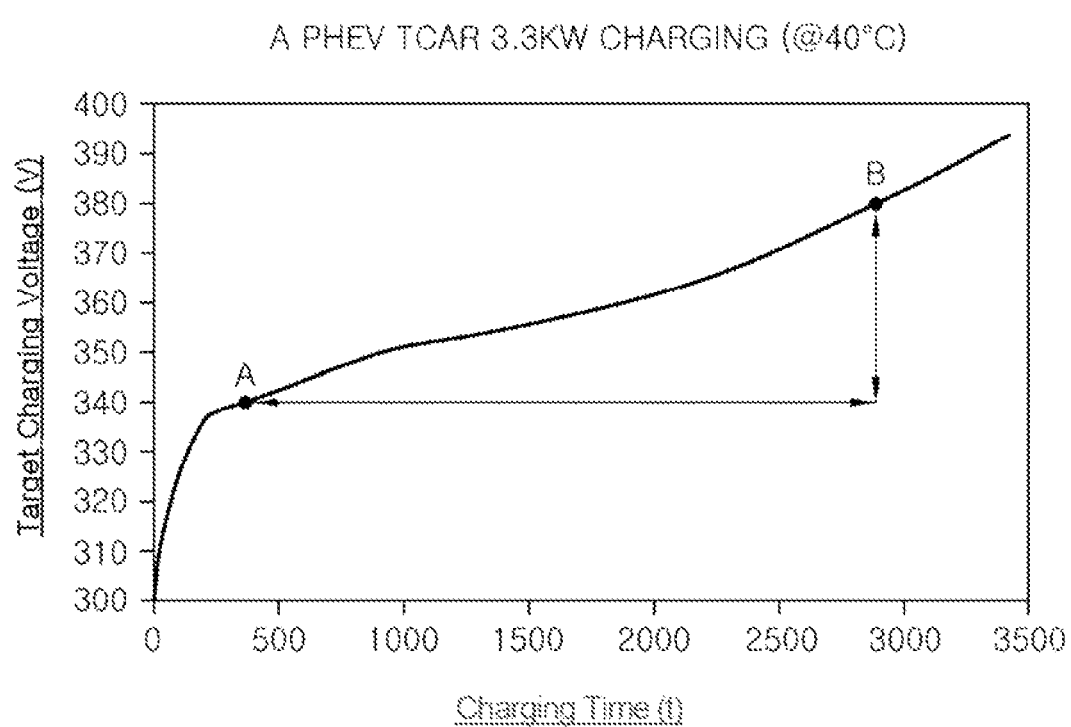
FIG. 3 is a graph illustrating a relationship between a charging time and a charging voltage when a battery is charged according to one embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, exemplary embodiments of the present disclosure will be described in detail with reference to the accompanying drawings.

Embodiments of the present disclosure relate to a method and a corresponding system for estimating degradation of a battery of an electric vehicle. The method of estimating degradation of a battery of an electric vehicle may be briefly referred to as a "method of estimating degradation" and the system for estimating degradation of a battery of an electric vehicle may be briefly referred to as a "system for estimating degradation."

When a battery in a vehicle is continuously used, degradation occurs in the battery. When the battery is degraded, resistance of the battery increases, and thus a time for completely charging (fully charging) the battery is shortened. That is, when the battery is charged using the same charging power and the battery is degraded, the time taken for full charging is shortened.

In an AE plug-in hybrid electric vehicle (PHEV) Tcar cell composite durability evaluation, a battery in a begin of life (BOL) state and the battery after nine months of use are slowly charged in the same environment (at a temperature of 30° C. and constant power charging (3.3 kW/96 cell) in SOC sections of 14 to 92%). Voltages and resistance values before and after charging of the two batteries did not change, but it was confirmed that charging times were shortened and it can be seen that resistance increase rates during charging were increased due to the increase in internal resistance according to degradation of the battery.

Consequently, the resistance increase rate of the battery may represent the degradation of the battery when the battery is charged. Embodiments of the present disclosure relate to a method and a corresponding system for estimating degradation of a battery using a resistance increase rate of the battery.

FIG. 1 is a flowchart illustrating a method of estimating degradation of a battery of an electric vehicle according to one embodiment of the present disclosure.

Referring to FIG. 1, the method includes an operation 110 of determining a current battery resistance increase rate, an operation 120 of determining an initial battery resistance increase rate, and an operation 130 of calculating a current battery degradation of the battery. Hereinafter, each operation will be described in more detail.

In operation 110, when the battery of the vehicle is charged using predetermined charging power at a predetermined battery temperature, the resistance of the battery, which increases during a charging period of the battery, is measured to determine a current battery resistance increase rate.

FIG. 3 illustrates a relationship between a charging time and a charging voltage when the battery is charged according to one embodiment of the present disclosure. When the battery is charged by a charging source, as the charging time is increased, the charging voltage also increased. Thus the charging graph of the battery shown in FIG. 3 generally forms a right upward curve. A resistance value of the battery may be obtained by dividing the charging voltage by a charging current value. A resistance increase rate, which increases during the charging period of the battery, may be determined by dividing a battery resistance value, which is increased during the charging period of the battery, by the charging period of the battery.

In determining of the resistance increase rate of the battery, the resistance of the battery, which is increased during a time period satisfying a specific condition of the entire charging period of the battery, may be measured to determine the resistance increase rate of the battery.

This is in consideration of the fact that a charging tendency (a state of charge (SOC) for starting charging, an SOC for termination, and the like) is different for each user of the vehicle, and the resistance of the battery tends to change rapidly at a high/low charging voltage or in an SOC range for a characteristic of each battery cell.

In one embodiment of the present disclosure, a specific condition may be a target charging voltage or a target SOC. For example, referring to FIG. 3, when a specific condition is a target charging voltage ranging from 340 V to 380 V, the resistance increase rate of the battery is determined by Equation 1 below.

$$V = (R_B - R_A)/(T_B - T_A) \quad \text{(Eq. 1)}$$

$R_A$ is a resistance value of the battery measured when a charging voltage of the battery is about 340 V (e.g., point A in FIG. 3), which is a start value of the target charging voltage. $R_B$ is a resistance value of the battery measured when the charging voltage of the battery is about 380 V (e.g., point B in FIG. 3), which is a termination value of the target charging voltage. $T_A$ is a time value when the charging voltage of the battery reaches 340 V, and $T_B$ is a time value when the charging voltage of the battery reaches 380 V.

As described above, since the resistance value changes during the time period satisfying a specific condition is measured, and thus the battery resistance increase rate is measured, there is a technical effect of improving accuracy of battery degradation estimation.

In another embodiment of the present disclosure, the specific condition may be a condition in which the battery is charged with a constant current. In other words, by measuring a resistance value of the battery changed during a time period in which the battery is charged with a constant current to measure the battery resistance increase rate, degradation of the battery may be measured more accurately without affecting a different charging profile for each battery.

In operation 120, an initial battery resistance increase rate is determined on the basis of a predetermined initial battery resistance increase rate map for indicating a battery resistance increase rate of a battery in a BOL state. Alternatively, a battery resistance increase rate in an initial state may use an initial value stored in advance in the vehicle by a user, a mechanic, or a manufacturer.

The initial battery resistance increase rate map is data providing a value of the resistance increase rate measured in advance with respect to the battery in the BOL state and is measured in advance and stored in a memory.

In one embodiment of the present disclosure, the initial battery resistance increase rate map may have a format in which a battery resistance increase rate corresponding to a battery temperature and battery charging power with respect to the battery in the BOL state is mapped.

FIG. 2 is a diagram illustrating an initial battery resistance increase rate map according to one embodiment of the present disclosure. As shown, the initial battery resistance increase rate map has a tabular format in which the battery resistance increase rate with respect to battery charging power is measured and stored according to the battery temperature.

Accordingly, when a charging power value and a battery temperature value of the battery are identified, the battery resistance increase rate value corresponding to the identified charging power value and the identified battery temperature value may be determined as the initial battery resistance increase rate.

With further reference to FIGS. 2 and 3, when the charging power for charging the battery is about 3.3 kW and the battery temperature of the is about 40° C., in the initial battery resistance increase rate map of FIG. 2, a resistance increase rate value V1c is mapped to a point at which the charging power is about 3.3 kW and the battery temperature is about 40° C. may be an initial battery resistance increase rate value.

As described above, using the battery resistance increase rate map in the BOL state is advantageous because the initial battery resistance increase rate may be obtained using only the charging power value of the battery and battery temperature value. Thus a required value may be quickly obtained. Furthermore, an amount of data processing is small and computing resources may be used more efficiently.

In operation 130, the current degradation of the battery is calculated on the basis of the current battery resistance increase rate and the initial battery resistance increase rate.

In one embodiment of the present disclosure, the current degradation of the battery may be calculated by calculating an incremental rate of the current battery resistance increase rate determined in operation 110 compared to the initial battery resistance increase rate determined in operation 120 and multiplying the calculated incremental rate by a degradation trend constant K. That is, the degradation of the battery may be expressed as in Equation 2 below:

$$V_{current}/V_{initial}*100*K\% \qquad (Eq. 2)$$

where $V_{current}$ is the current battery resistance increase rate, $V_{initial}$ is the initial battery resistance increase rate, and K is the degradation trend constant.

Here, the degradation trend constant K is a proportional constant of battery degradation compared to the resistance increase rate of the battery derived by a degradation principle test of the battery. A degradation value after actual battery degradation through accelerated degradation (e.g., high temperature durability). The resistance increase rate value during charging may be measured to substitute the measured values into Equation 3 below, thereby obtaining the degradation trend constant K.

$$\text{battery degradation} = K * \text{resistance increase rate during charging} \qquad (Eq. 3)$$

In one embodiment of the present disclosure, the current battery degradation calculated in operation 130 may be stored as a latest degradation value of the vehicle in a battery management system (BMS). This stored latest degradation value may be used in battery charging management and used for cooperative control with other controllers in the vehicle.

FIG. 4 is a flowchart illustrating a method of estimating degradation of a battery of an electric vehicle according to one embodiment of the present disclosure. In operation 410, a controller of the vehicle may be configured to determine whether to start charging of the battery of the vehicle. When it is determined that the charging of the battery is not started, a standby state may be executed, and operation 410 may be repeated again later.

In one embodiment of the present disclosure, the controller may not determine whether the charging of the vehicle is started. Rather, the controller may be further configured to receive a signal indicating that the charging of the vehicle is started, thereby directly executing operation 420. That is, in such embodiments, the operation 410 can be bypassed or omitted from the method of FIG. 4.

In operation 420, when the charging of the vehicle is started, the controller identifies predetermined charging power at which the charging is performed. The predetermined charging power at which the charging is performed may be calculated by measuring a voltage and a current of a charging source which charges the battery.

In operation 430, the controller determines whether the charging of the battery is performed during a specific time period. In one embodiment of the present disclosure, the specific time period in which the charging of the battery is performed may be a time period which satisfies a target charging voltage or a target SOC during the entire charging period.

In another embodiment of the present disclosure, the specific time period in which the charging of the battery is performed may be a time period in which the battery is charged with a constant current during the entire charging period. As described above, since a resistance value varied during the specific time period is measured, and thus the battery resistance increase rate is measured, there is a technical effect of improving accuracy of battery degradation estimation.

In operation 440, when the charging of the battery is performed during the specific time period, the controller identifies a temperature of the battery.

In operation 450, the controller measures an increase in the resistance of the battery during the specific time period to determine the current battery resistance increase rate. The current battery resistance increase rate may be obtained by dividing a resistance value of the battery increased during the specific time period by a length of the specific time period, thereby obtaining the resistance value of the battery varied for a unit time, that is, the battery resistance increase rate.

In operation 460, the controller determines an initial battery resistance increase rate on the basis of a predetermined initial battery resistance increase rate map for indicating the battery resistance increase rate of the battery in the BOL state.

The initial battery resistance increase rate map includes information on a value of the resistance increase rate measured in advance with respect to the battery in the BOL state. In one embodiment of the present disclosure, the initial battery resistance increase rate map may have a format in which a battery resistance increase rate corresponding to a battery temperature and battery charging power with respect to the battery in the BOL state is mapped.

In operation 470, the controller calculates an incremental rate of the current battery resistance increase rate compared to the initial battery resistance increase rate. The incremental rate may be obtained as a percentage (%) value by dividing the current battery resistance increase rate by the initial battery resistance increase rate and then multiplying by 100.

In operation 480, the controller calculates the degradation of the battery by multiplying the incremental rate obtained in operation 470 by a degradation trend constant K.

The degradation trend constant K is a proportional constant of battery degradation compared to the resistance increase rate of the battery derived by a degradation principle test of the battery. The degradation trend constant K may be calculated by measuring a degradation value after actual battery degradation through accelerated degradation (e.g., high temperature durability) and the resistance increase rate value during charging.

In operation 490, the degradation of the battery estimated in operation 480 is stored as the latest battery degradation with respect to the vehicle, representing an updated calculated battery degradation. In one embodiment of the present disclosure, the estimated value of the battery degradation may be stored in the BMS.

FIG. 5 is a block diagram illustrating a system for estimating degradation of a battery of an electric vehicle according to one embodiment of the present disclosure.

Referring to FIG. 5, a battery degradation estimation system 500 of an electric vehicle according to one embodiment of the present disclosure is illustrated and includes a battery 510, a charger 520, a measurement device 530, and a degradation diagnosis part 540.

The battery 510 is a high-voltage battery installed inside the vehicle and configured to supply power for driving a motor.

The charger 520 is mounted in the vehicle and receives electrical power from a power supply (not shown) to charge the battery 510. In this case, the charger 520 charges the battery 510 with the same charging power.

The measurement device 530 measures charging environment information of the battery 510 and includes a temperature sensor 531, a voltage sensor 532, and a current sensor 533.

The temperature sensor 531 is configured to measure a cell temperature of the battery 510. In order to charge the battery 510, the voltage sensor 532 is configured to measure a charging voltage output from the charger 520, and the current sensor 533 is configured to measure a charging current supplied from the charger 520 to the battery 510. In addition, the measurement device 530 may be further configured to store and manages measurement data measured by the sensors 531, 532, and 533 in a memory (not shown).

The degradation diagnosis part 540, e.g., the controller, is configured to receive the charging environment information of the battery 510 measured by the measurement device 530 and to calculate the battery degradation of the vehicle to thereby calculate an estimated value of the battery degradation of the vehicle. The degradation diagnosis part 540 includes a mapping data storage 541, a degradation calculator 542, and a degradation storage 543.

The mapping data storage 541 is configured to store an initial battery resistance increase rate map preset for indicating the battery resistance increase rate with respect to the battery in the BOL state. The initial battery resistance increase rate map is data indicating a value of the resistance increase rate measured in advance with respect to the battery in the BOL state and is measured in advance and stored in the memory. In one embodiment of the present disclosure, the initial battery resistance increase rate map may have a format in which a battery resistance increase rate corresponding to a battery temperature and battery charging power with respect to the battery in the BOL state is mapped.

By using predetermined charging power at a predetermined battery temperature, when the battery is charged, the degradation calculator 542 is configured to measure resistance of the battery increased during a charging period of the battery using a charging voltage and a charging current values measured by the measurement device 530 to determine the battery resistance increase rate. The degradation calculator 542 may be further configured to determine an initial battery resistance increase rate on the basis of the initial battery resistance increase rate map stored in the mapping data storage 541, and to calculate current degradation of the battery on the basis of the current battery resistance increase rate and the initial battery resistance increase rate.

In determining the resistance increase rate of the battery, the degradation calculator 542 may be configured to measure the resistance of the battery, which increases during a time period satisfying a specific condition of the entire charging period of the battery, in order to determine the resistance increase rate of the battery. This is in consideration of the fact that a charging tendency (an SOC for starting charging, an SOC for termination, and the like) is different for each user of the vehicle, and the resistance of the battery tends to change rapidly at a high/low charging voltage or in an SOC range for a characteristic of each battery cell.

In one embodiment of the present disclosure, a specific condition may be a target charging voltage or a target SOC. In another embodiment of the present disclosure, the specific condition may be a condition in which the battery is charged with a constant current.

The degradation calculator 542 may be configured to receive the predetermined battery temperature and the predetermined charging power at which the battery is charged from the measurement device 530. The degradation calculator 542 may be further configured to determine, in the initial battery resistance increase rate map stored in the mapping data storage 541, a mapped battery resistance increase rate value corresponding to the measured values of the predetermined battery temperature and the predetermined charging power received from the measurement device 530 as the initial battery resistance increase rate.

Thereafter, the degradation calculator 542 may be configured to calculate the current battery degradation on the basis of the current battery resistance increase rate compared to the initial battery resistance increase rate.

In one embodiment of the present disclosure, the degradation calculator 542 may be configured to calculate the current degradation of the battery by calculating an incremental rate of the current battery resistance increase rate compared to the initial battery resistance increase rate and multiplying the calculated incremental rate by a degradation trend constant K.

The degradation trend constant K is a proportional constant of battery degradation compared to the resistance increase rate of the battery derived by a degradation principle test of the battery and may be calculated by measuring a degradation value after actual battery degradation through accelerated degradation (high temperature durability) and the resistance increase rate value during charging.

The degradation storage 543 may also be configured to store the calculated current battery degradation as the latest estimated value of the battery degradation of the vehicle. In one embodiment of the present disclosure, when the degradation of the battery is newly calculated later, the degradation storage 543 updates the previously stored degradation of the battery with the newly calculated battery degradation value as the latest battery degradation value.

Beneficially, embodiments of the battery degradation estimation system 500 provide more accurate estimates of the battery degradation through a simplified arithmetic operation so that the battery of the vehicle may be efficiently managed.

The embodiments according to the present disclosure may be implemented by various parts, for example, hardware, firmware, software, or a combination thereof. In the case of implementation by the hardware, one embodiment of the present disclosure may be implemented by one or more application specific integrated circuits (ASICs), digital signal processors (DSPs), digital signal processing devices (DSPDs), programmable logic devices (PLDs), FPGAs (field programmable gate arrays), processors, controllers, microcontrollers, microprocessors, and the like.

In the case of implementation by the firmware or the software, one embodiment of the present disclosure may be implemented in the form of a module, a procedure, a function, and the like which perform the above-described functions or operations. A software code may be stored in a memory unit and driven by the processor. The memory unit may be located inside or outside the processor and may transmit and receive data to and from the processor by various known parts.

In accordance with embodiments of the methods and corresponding systems disclosed herein degradation of a battery may be estimated. As an example, battery degradation of a vehicle can be estimated on the basis of comparing a battery resistance increase rate after degradation compared to an initial battery resistance increase rate. This provides a technical effect of capability to estimate a battery degradation value more accurately through a simplified arithmetic operation.

The exemplary embodiments of the present disclosure have been described. It can be understood by those skilled in the art to which the present disclosure pertains that the present disclosure can be implemented in modified forms without departing from the essential feature of the present disclosure. Therefore, the disclosed embodiments should be considered as an illustrative rather than a determinative. The scope of the present disclosure is defined by the appended claims rather than by the foregoing description, and all differences within the scope of equivalents thereof should be construed as being included in the present disclosure.

What is claimed is:

1. A method of estimating degradation of a battery for a vehicle, the method comprising:
   determining a current battery resistance increase rate by measuring an increase in resistance of the battery during charging of the battery;
   determining an initial battery resistance increase rate; and
   calculating current degradation of the battery on the basis of the current battery resistance increase rate and the initial battery resistance increase rate,
   wherein a map for determining the initial battery resistance increase rate includes information regarding a battery resistance increase rate corresponding to a battery temperature and battery charging power that is mapped with respect to the battery in a begin of life (BOL) state.

2. The method of claim 1, wherein determining the initial battery resistance increase rate comprises:
   identifying a temperature value of the battery and a charging power value for charging the battery; and
   determining, in the initial battery resistance increase rate map, a mapped battery resistance increase rate value corresponding to the temperature value of the battery and the charging power value as the initial battery resistance increase rate.

3. The method of claim 1, wherein determining the current battery resistance increase rate comprises measuring the resistance of the battery, which is increased during a time period satisfying a specific condition of the entire charging period of the battery.

4. The method of claim 3, wherein the specific condition comprises either a condition in which the battery is charged in a predetermined target voltage section or a condition in which the battery is charged in a predetermined target state of charge (SOC) section.

5. The method of claim 3, wherein the specific condition comprises a condition in which the battery is charged with a constant current.

6. The method of claim 1, wherein calculating the current battery degradation comprises:
   calculating an incremental rate of the current battery resistance increase rate compared to the initial battery resistance increase rate; and
   calculating a current battery degradation value by multiplying the incremental rate by a degradation trend constant K.

7. The method of claim 6, wherein the degradation trend constant K is a proportional constant of the battery degradation compared to the resistance increase rate of the battery derived by a degradation principle test of the battery.

8. The method of claim 1, further comprising updating the calculated current battery degradation value to the latest battery degradation value of the vehicle.

9. A method of estimating degradation of a battery for a vehicle, comprising:
   determining whether to start charging of the battery of the vehicle;
   when the battery charging is started, detecting charging power for charging the battery;
   determining whether the battery charging of is performed during a specific time period;
   when the battery charging is performed during the specific time period, measuring a temperature of the battery;
   determining a current battery resistance increase rate by measuring resistance of the battery increased during the specific time period;
   determining an initial battery resistance increase rate;
   calculating an incremental rate of the current battery resistance increase rate compared to the initial battery resistance increase rate; and
   calculating degradation of the battery by multiplying the incremental rate of the current battery resistance increase rate compared to the initial battery resistance increase rate by a degradation trend constant,
   wherein a map for determining the initial battery resistance increase rate includes information regarding a battery resistance increase rate corresponding to a battery temperature and battery charging power that is mapped with respect to the battery in a begin of life (BOL) state.

10. A system for estimating degradation of a battery for a vehicle, comprising:
    the battery configured to supply power for driving a motor of the vehicle;
    a charger configured to charge the battery;
    a measurement device configured to measure characteristics of the battery and the charger; and
    a controller configured to calculate current degradation of the battery,
    wherein the controller comprises:
        a mapping data storage configured to store an initial battery resistance increase rate map; and
        a degradation calculator configured to:
            measure resistance of the battery increased during a charging period of the battery,
            determine a current battery resistance increase rate,
            determine an initial battery resistance increase rate on the basis of the initial battery resistance increase rate map, and
            calculate the current battery degradation of the battery on the basis of a current battery resistance increase rate and the initial battery resistance increase rate,
    wherein the initial battery resistance increase rate map comprises information in which a battery resistance increase rate corresponding to a battery temperature and battery charging power is mapped with respect to the battery in a begin of life (BOL) state.

11. The system of claim 10, wherein:
    the measurement device is configured to measure the temperature of the battery and the charging power for charging the battery and to provide the measured values to the degradation calculator; and
    the degradation calculator is configured to determine, in the initial battery resistance increase rate map, a mapped battery resistance increase rate value corresponding to the measured values of the temperature of the battery and the charging power, which are received from the measurement device, as the initial battery resistance increase rate.

12. The system of claim 10, wherein the degradation calculator is configured to calculate an incremental rate of the current battery resistance increase rate compared to the initial battery resistance increase rate and to calculate the current battery degradation by multiplying the incremental rate by a degradation trend constant K.

13. The system of claim 10, wherein the controller further comprises a degradation storage configured to update the calculated current battery degradation as the latest battery degradation value of the vehicle.

* * * * *